(12) United States Patent
Amin et al.

(10) Patent No.: US 10,928,561 B2
(45) Date of Patent: Feb. 23, 2021

(54) ENCLOSURES HAVING AN IMPROVED TACTILE SURFACE

(71) Applicant: CORNING INCORPORATED, Corning, NY (US)

(72) Inventors: Jaymin Amin, Corning, NY (US); Yuhui Jin, Painted Post, NY (US); Timothy James Kiczenski, Corning, NY (US); Michelle Diane Pierson-Stull, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/677,869

(22) Filed: Nov. 8, 2019

(65) Prior Publication Data

US 2020/0073027 A1 Mar. 5, 2020

Related U.S. Application Data

(62) Division of application No. 15/407,964, filed on Jan. 17, 2017, now Pat. No. 10,473,829.

(Continued)

(51) Int. Cl.
*G02B 5/02* (2006.01)
*C03C 23/00* (2006.01)
(Continued)

(52) U.S. Cl.
CPC ............. *G02B 5/021* (2013.01); *B24C 1/00* (2013.01); *C03C 3/097* (2013.01); *C03C 15/00* (2013.01);
(Continued)

(58) Field of Classification Search
CPC ........ G02B 5/021; G02B 1/18; G02B 5/0278; G02B 5/08; C03C 23/0075; C03C 15/00;
(Continued)

(56) References Cited

U.S. PATENT DOCUMENTS 3,616,098 A 10/1971 Falls
5,491,115 A 2/1996 Pfitzenmaier et al.
(Continued)

FOREIGN PATENT DOCUMENTS

CN 101142148 A 3/2008
JP 1100229 A 4/1999
(Continued)

OTHER PUBLICATIONS

TW106101634 Search Report dated Apr. 13, 2020; 1 page; Taiwan Patent Office.
(Continued)

*Primary Examiner* — William R Alexander
*Assistant Examiner* — Henry A Duong
(74) *Attorney, Agent, or Firm* — Jeffrey A. Schmidt

(57) ABSTRACT

Embodiments of an electronic device comprising an enclosure and electrical components disposed at least partially inside the enclosure, wherein the enclosure comprises a substrate having a tactile surface are disclosed. The tactile surface may include a textured surface, a coated surface or a coated textured surface that exhibits a low fingerprint visibility, when a fingerprint is applied to the tactile surface. In one or more embodiments, the substrate exhibits an average transmittance of about 80% or greater over the visible spectrum, a coefficient of friction less than about 0.3, a surface roughness Ra of about 500 nm or greater, and either one or both a transmission haze greater than about 60%, and a reflection haze at either 2 degrees from specular or 5 degrees from specular greater than 60%.

16 Claims, 12 Drawing Sheets

Related U.S. Application Data

(60) Provisional application No. 62/383,888, filed on Sep. 6, 2016, provisional application No. 62/279,893, filed on Jan. 18, 2016.

(51) Int. Cl.

| | |
|---|---|
| *C03C 15/00* | (2006.01) |
| *C03C 3/097* | (2006.01) |
| *B24C 1/00* | (2006.01) |
| *C03C 17/30* | (2006.01) |
| *G02B 1/18* | (2015.01) |
| *H05K 5/00* | (2006.01) |
| *H05K 5/03* | (2006.01) |

(52) U.S. Cl.
CPC .......... *C03C 17/30* (2013.01); *C03C 23/0075* (2013.01); *G02B 1/18* (2015.01); *G02B 5/0278* (2013.01); *H05K 5/0017* (2013.01); *H05K 5/0086* (2013.01); *H05K 5/03* (2013.01); *C03C 2217/76* (2013.01); *C03C 2218/112* (2013.01); *C03C 2218/34* (2013.01)

(58) Field of Classification Search
CPC ... C03C 3/097; C03C 17/30; C03C 2218/112; C03C 2217/76; C03C 2218/34; C03C 4/02; B24C 1/00; H05K 5/0017; H05K 5/0086; H05K 5/03; B60J 3/00
USPC ........................................................ 359/609
See application file for complete search history.

(56) References Cited

U.S. PATENT DOCUMENTS

| | | | |
|---|---|---|---|
| 6,527,628 B2 | 3/2003 | Ito et al. | |
| 6,936,555 B2 | 8/2005 | Pinckney | |
| 7,465,687 B2 | 12/2008 | Beall | |
| 8,740,401 B2 | 6/2014 | Bian et al. | |
| 9,023,457 B2 | 5/2015 | Carrilero et al. | |
| 9,701,576 B2 | 7/2017 | Bockmeyer et al. | |
| 2009/0160819 A1 | 6/2009 | Sasaki et al. | |
| 2009/0258246 A1 | 10/2009 | Wu et al. | |
| 2011/0051053 A1 | 3/2011 | Okamura et al. | |
| 2011/0062849 A1 | 3/2011 | Carlson et al. | |
| 2012/0003779 A1 | 1/2012 | Young | |
| 2012/0134025 A1 | 5/2012 | Hart | |
| 2012/0135848 A1 | 5/2012 | Beall et al. | |
| 2013/0040116 A1 | 2/2013 | Henze et al. | |
| 2013/0136909 A1 | 5/2013 | Mauro et al. | |
| 2014/0087194 A1 | 3/2014 | Dejneka et al. | |
| 2014/0090864 A1* | 4/2014 | Paulson | B32B 17/06 174/50 |
| 2015/0010720 A1 | 1/2015 | Saijo et al. | |
| 2015/0299034 A1 | 10/2015 | Hou et al. | |
| 2015/0370339 A1 | 12/2015 | Ligtenberg et al. | |
| 2016/0368308 A1 | 12/2016 | Bazemore et al. | |

FOREIGN PATENT DOCUMENTS

| | | |
|---|---|---|
| JP | 1100230 A | 4/1999 |
| JP | 2014160543 A | 9/2014 |
| KR | 1336935 B1 | 12/2013 |
| WO | 2012075068 A2 | 6/2012 |
| WO | 2014070869 A1 | 5/2014 |
| WO | 2016138051 A1 | 9/2016 |

OTHER PUBLICATIONS

Barnes et al. "Surface finish and touch—a case study in a new human factors tribiology" Wear 257 (2004) pp. 740-750.
International Search Report and Written Opinion PCT/US2017/013842 dated Apr. 3, 2017.
English Translation of CN201780007154.5 Office Action dated Jul. 23, 2020; 9 Pages; Chinese Office Patent.

* cited by examiner

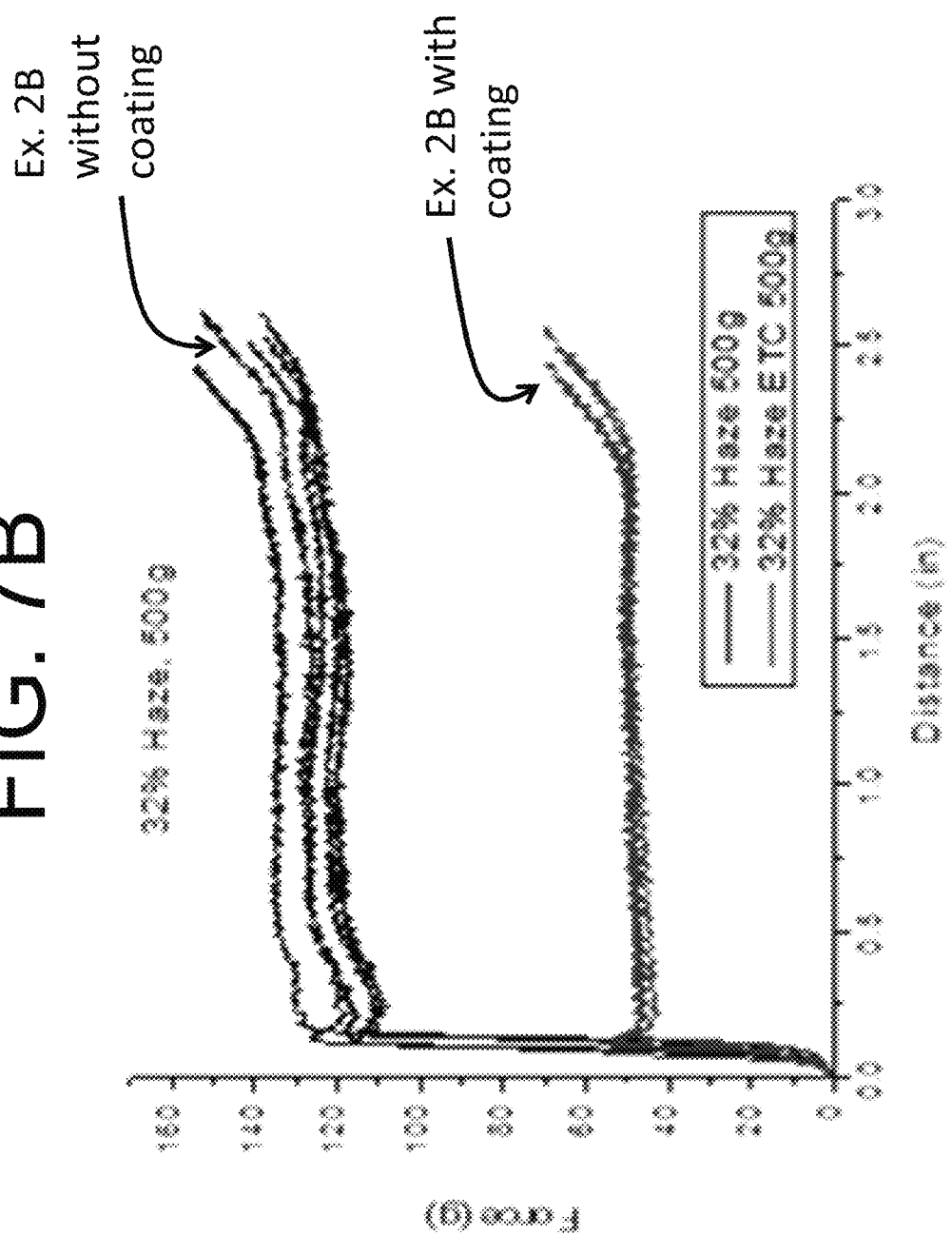

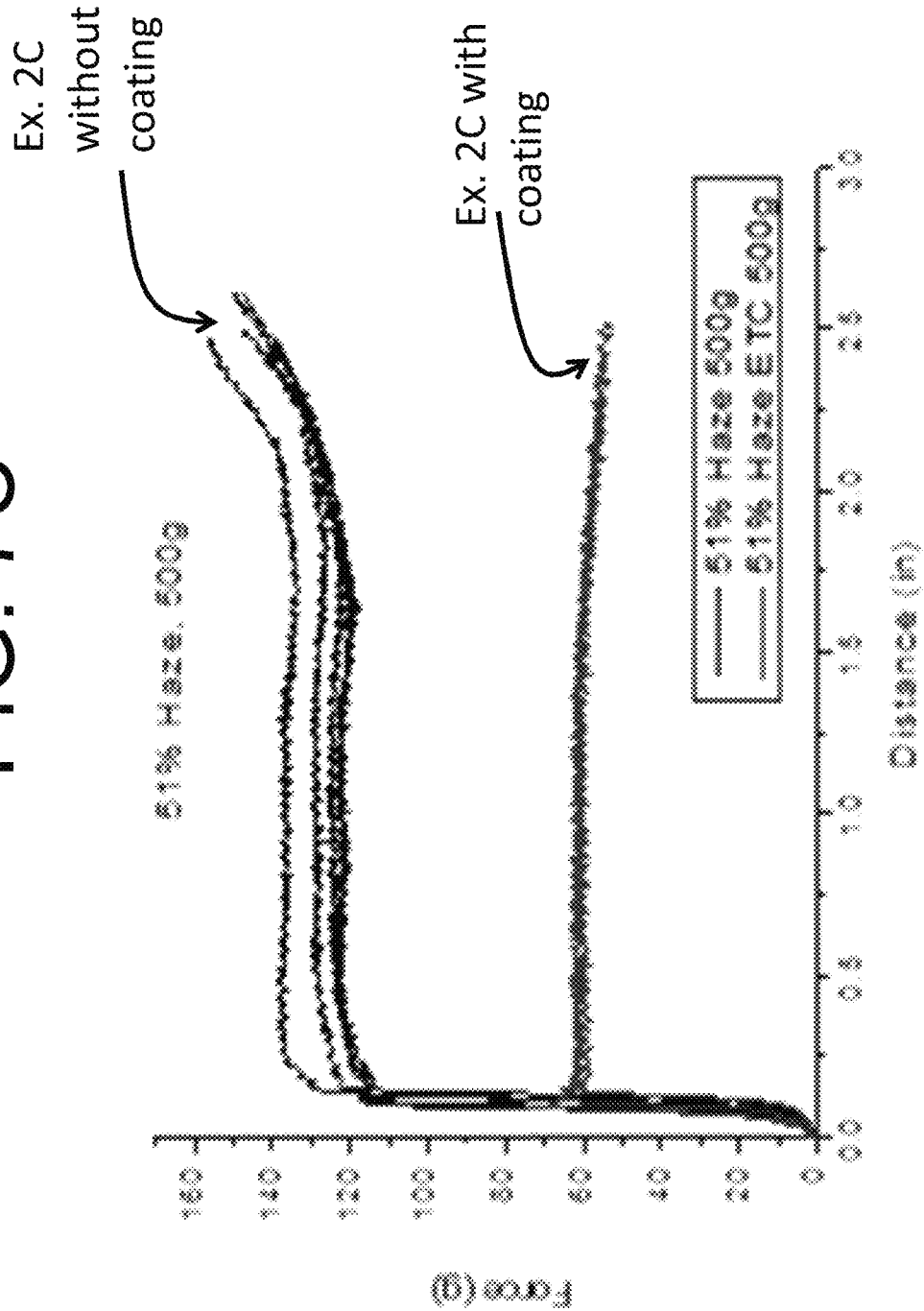

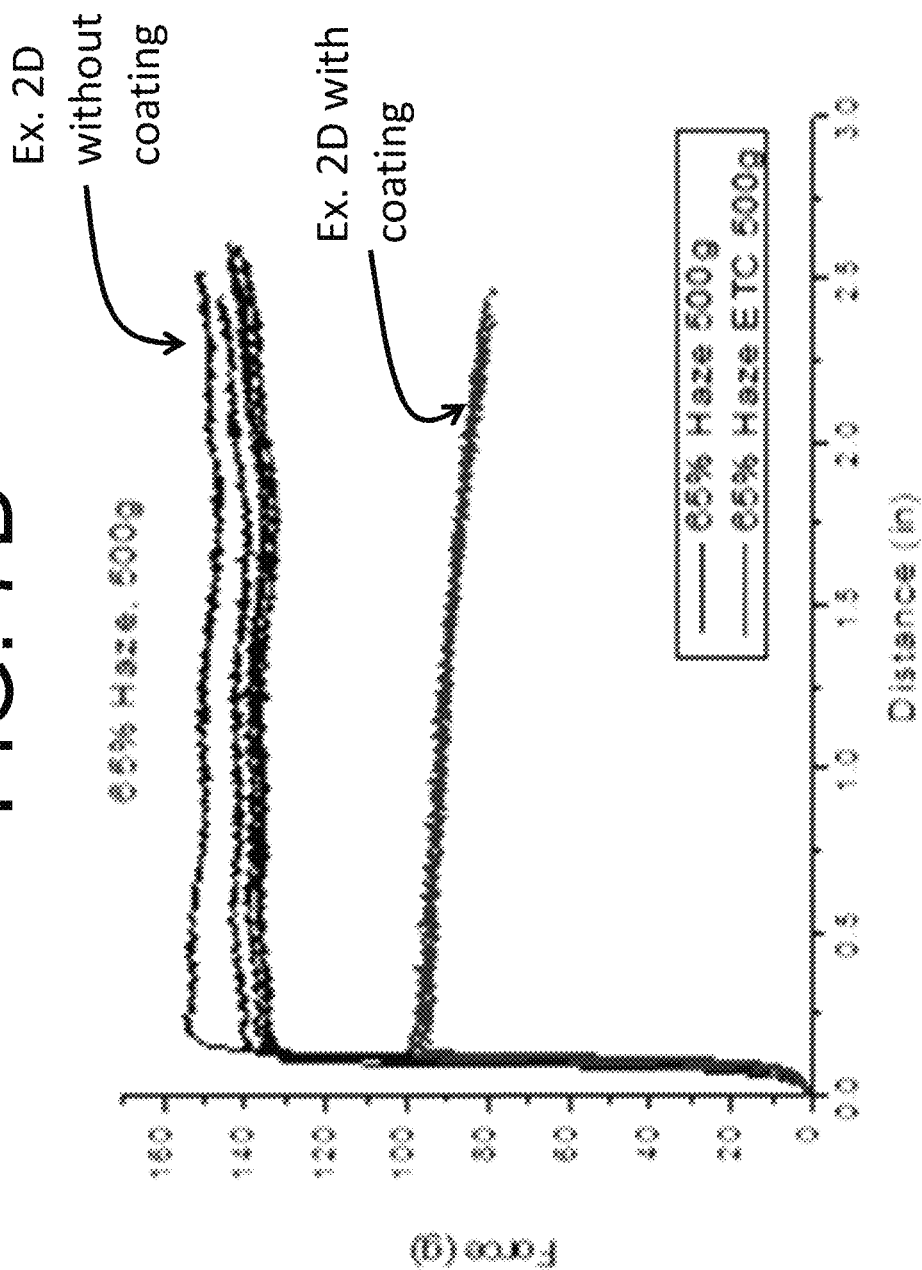

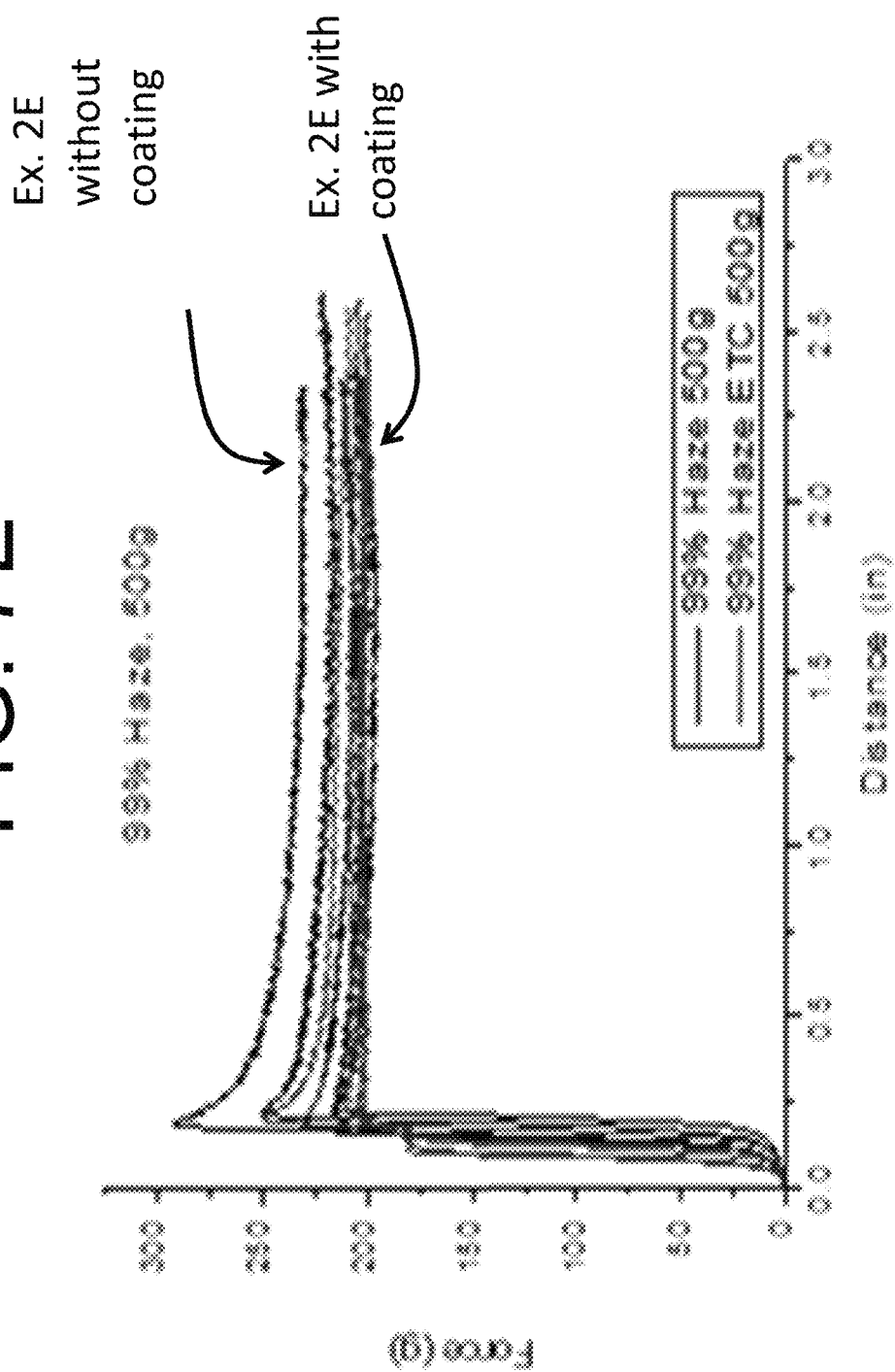

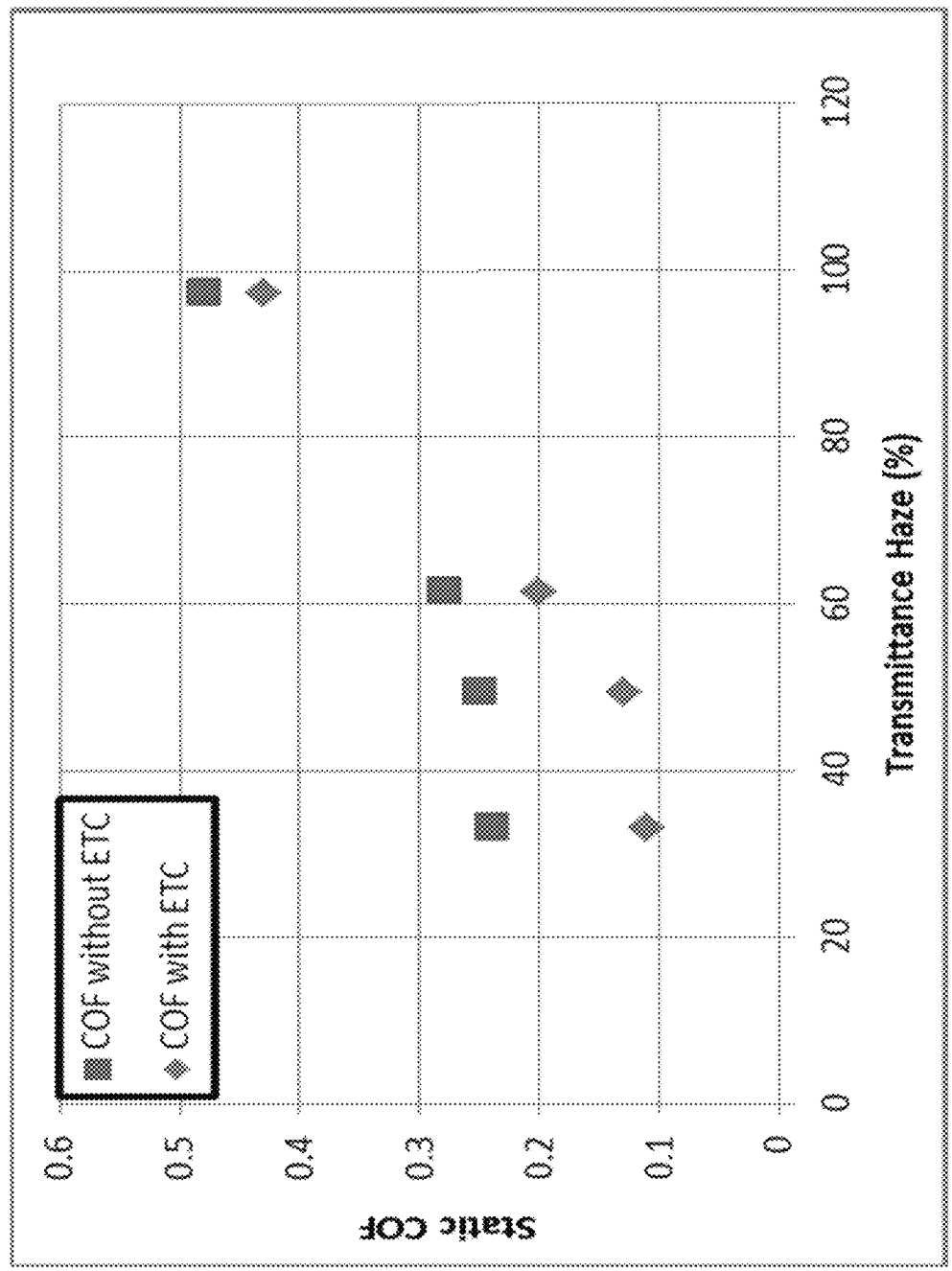

ENCLOSURES HAVING AN IMPROVED TACTILE SURFACE

CROSS-REFERENCE TO RELATED APPLICATIONS

This application is a divisional application and claims the benefit of priority under 35 U.S.C. § 120 of U.S. application Ser. No. 15/407,964 filed on Jan. 17, 2017, which in turn, claims the benefit of priority under 35 U.S.C. § 119 of U.S. Provisional Application Ser. No. 62/383,888 filed on Sep. 6, 2016 and U.S. Provisional Application Ser. No. 62/279,893 filed on Jan. 18, 2016, the contents of each of which are relied upon and incorporated herein by reference in their entireties.

TECHNICAL FIELD

This disclosure relates to enclosures for electronic devices and more particularly to enclosures including an improved tactile surface that permits transmission of wireless data transmission or wireless charging energy therethrough.

BACKGROUND

As portable electronic devices such as laptops, tablets, media players, and mobile phones have become smaller, lighter in weight and more powerful, the design of some components and enclosures of the portable computing devices must be improved. This design of such enclosures should be lighter in weight and thinner, but strong and rigid. The lighter weight enclosures, which typically use thin plastic structures and few fasteners, tend to be more flexible, are prone to scratching, and have a greater tendency to buckle and bow as opposed to stronger and more rigid enclosures which typically use thicker plastic structures and more fasteners which are thicker and have more weight. The increased weight of the stronger and more rigid structures may lead to user dissatisfaction, and bowing/buckling of the lighter weight structures may damage the internal parts of the portable electronic devices.

From an aesthetic standpoint, surfaces which exhibit an improved tactile surface or feel and which are also resistant to the transfer or smudging of fingerprints are desired in enclosures. For applications related to electronic devices, the general requirements for such surfaces include high transmission, controlled haze, resistance to fingerprint transfer, and robustness to handling. A fingerprint-resistant surface must be resistant to both water and oil transfer when touched by a finger or skin of a user.

In view of the foregoing problems with existing enclosures, there is a need for improved enclosures for portable electronic devices. In particular, there is a need for enclosures that are more cost effective, smaller, lighter, stronger and aesthetically more pleasing than current enclosure designs.

SUMMARY

A first aspect of this disclosure pertains to an electronic device comprising an enclosure; and electrical components disposed at least partially inside the enclosure and including at least a controller, a memory, and a display. In one or more embodiments, the enclosure comprises a substrate that exhibits an average transmittance of about 80% or greater over the visible spectrum. In some instances, the substrate exhibits a kinetic coefficient of friction (COF) less than about 0.3, when measured using the COF Test Method, as described herein. In some instances, the substrate exhibits a static coefficient of friction (COF) less than about 0.3, when measured using the COF Test Method. In some instances, the substrate comprises a surface having a surface roughness Ra of about 500 nm or greater or about 900 nm or greater. In one or more embodiments, the substrate exhibits a either one or both a transmission haze greater than about 60%, and a reflection haze at either 2 degrees from specular or 5 degrees from specular greater than 60%. The transmittance haze and/or the specular haze may be about 90% or greater.

In some embodiments, the substrate may be described as glass-based. In some embodiments, the substrate comprises an amorphous substrate or a crystalline substrate. Embodiments including an amorphous substrate may include any one of a soda lime glass, an alkali aluminosilicate glass, an alkali containing borosilicate glass and an alkali aluminoborosilicate glass. The amorphous substrate of some embodiments may be strengthened and may include any one or more of a compressive surface layer having a depth of compressive layer (DOC) greater than or equal to 20 μm, a compressive stress greater than 400 MPa, and a central tension of more than 20 MPa. In some embodiments, the substrate is a crystalline substrate comprises a strengthened glass ceramic substrate, a non-strengthened glass-ceramic, or a single crystal substrates.

The substrate may include an ink layer, a hydrophobic material, an oleophobic material or a material that exhibits both hydrophobicity and oleophobicity, disposed a major surface of the substrate. In some options, the substrate may include a colored glass.

In some embodiments, the substrate may include a plurality of surface features having a longest cross-sectional dimension in the range from about 10 micrometers to about 100 micrometers (or from about 10 micrometers to about 50 micrometers). In some embodiments, the plurality of features has an average longest cross-sectional dimension that is about 2 times or less than the longest cross-sectional dimension.

BRIEF DESCRIPTION OF DRAWINGS

FIGS. 7A-7E are graphs showing the impact of easy-to-clean (ETC) coating on COF for the different haze and roughness levels of Examples 2A-2E; and FIG. 8 is a graph showing the static COF of Examples 2B-2E as a function of transmittance haze.

DETAILED DESCRIPTION

As is described herein below, there is a need for more cost effective, smaller, lighter, stronger and aesthetically more pleasing enclosures for portable electronic devices. Such devices may include mobile phones, media (including music) players, laptop or notebook computers, tablets, gaming devices, electronic book readers and other devices. Embodiments of this disclosure pertain to suitable materials for such enclosures, which exhibit weight and/or resistance to impact damage (e.g., denting) and include an improved tactile surface. Unlike many of the known materials used for enclosures, in particular metallic enclosures, the materials described herein do not interfere with wireless communications. For example, the enclosure may permit transmission of radio frequency, microwaves, magnetic fields, inductive fields, wireless data transmission, wireless charging energy or combinations thereof. Some embodiments of this disclosure pertain to electronic devices including the enclosures described herein.

Figure 1:
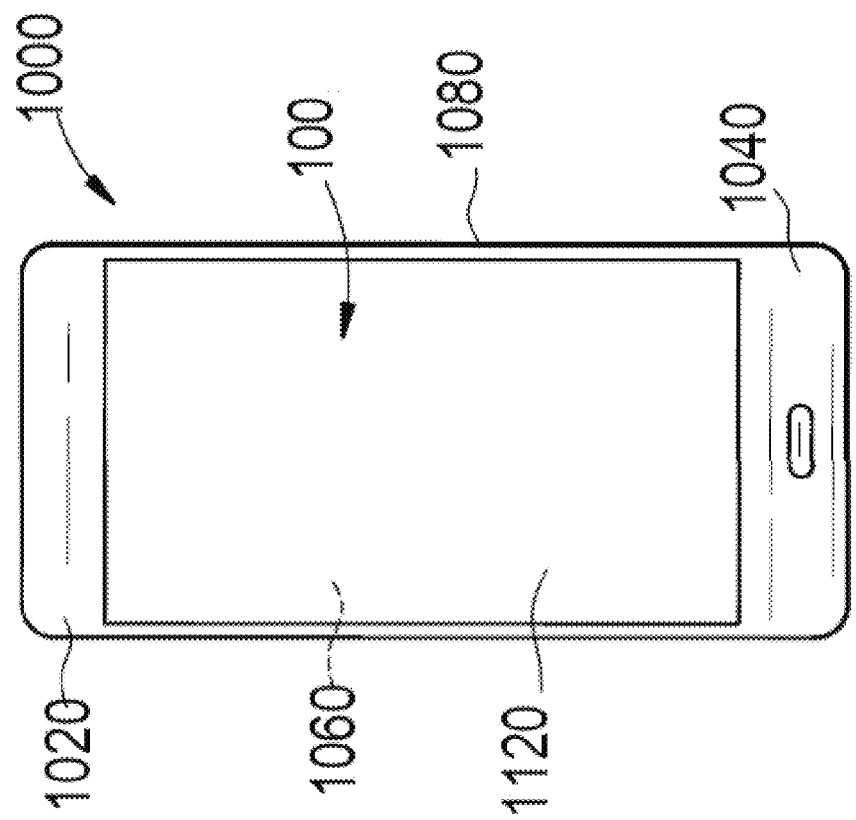
FIG. 1 is a front view of an electronic device according to one or more embodiments.
Figure 2:
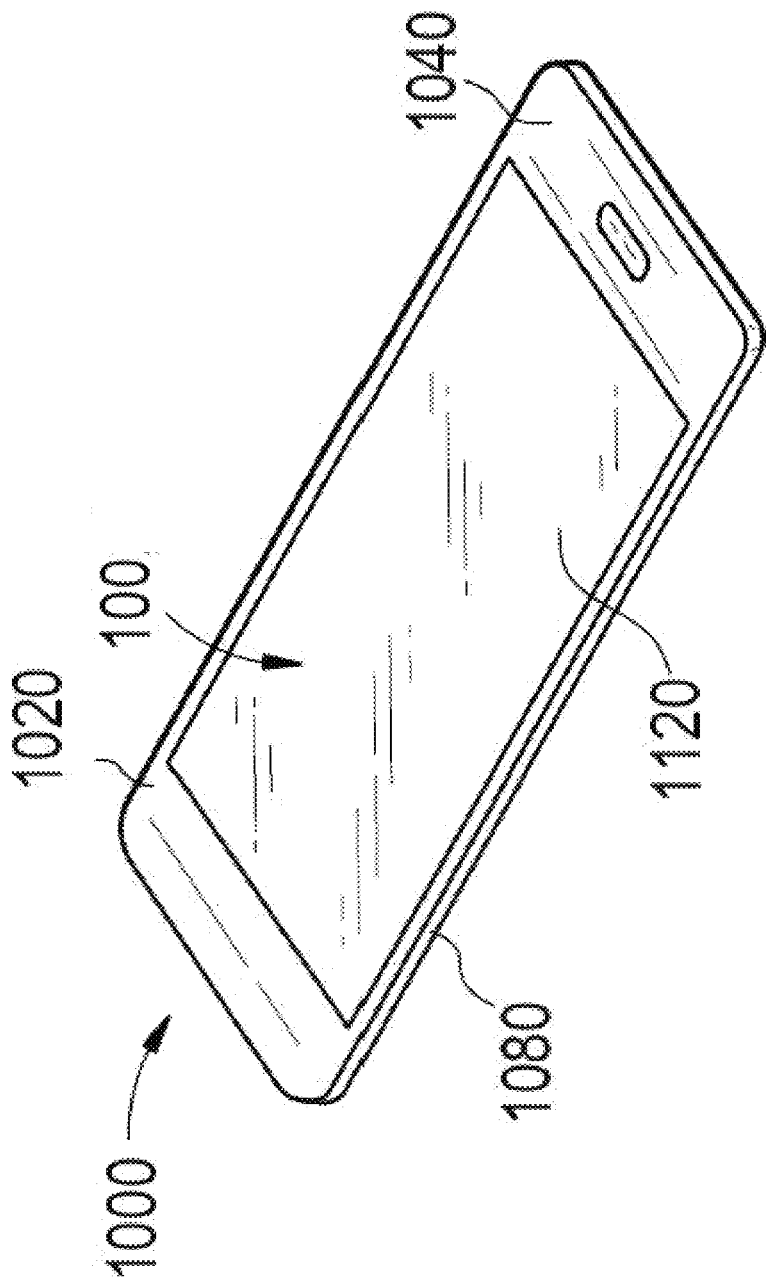
FIG. 2 is a perspective view of the electronic device of FIG. 1.

A first aspect of this disclosure pertains to an electronic device including an embodiment of the enclosures described herein, and is illustrated in FIGS. 1-2. The electronic device 1000 includes an enclosure 1020 having a front surface 1040, a back surface 1060, and side surfaces 1080; and electrical components (not shown) that are at least partially inside or entirely within the enclosure. The electronic components include at least a controller, a memory, and a display 1120, which may be at or adjacent to the front surface of the enclosure. The display 1120 may be present on the side surfaces 1080 and/or the back surface 1060. In the embodiment shown in FIGS. 1 and 2, a cover glass 100 is disposed over the display 1120. In one or more embodiments, the enclosure includes a substrate including a tactile surface, as will be described herein. As used herein the terms "enclosure" maybe used interchangeably with "housing" and "protective cover".

Figure 3:
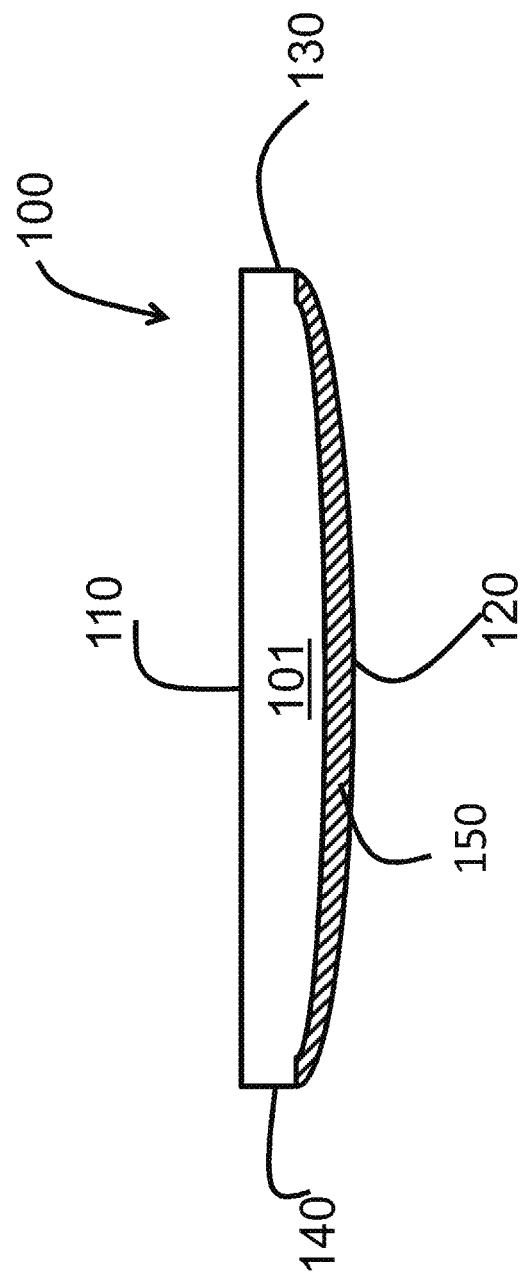
FIG. 3 is a side view of an enclosure according to one or more embodiments.

As shown in FIG. 3, the enclosure 100 may include a substrate 101, which forms the entirety of the enclosure. In some embodiments, the substrate may form a portion of the enclosure. As shown in FIG. 3, the substrate includes opposing major surfaces, 110, 120 and opposing minor surfaces 130, 140, though other configurations are possible. In some embodiments, the enclosure covers non-display areas or components of an electronic device. Such enclosures can form a back surface of an electronic device and/or any of the edges of the electronic device. In one or more embodiments, one major surface 120 of the substrate may form an exterior surface of the electronic device and the other major surface 110 may form an interior surface of the enclosure and is adjacent to internal components of the electronic device. The major surface 110 forming the interior surface may include a coating forming a decorative feature, which may include a coating imparting a color, graphic, metallized surface and the like. In some embodiments, only one or both the major surfaces may include the tactile surface described herein. In some embodiments, all of the surfaces (110, 120, 130, 140) may include the tactile surface described herein. In some embodiments, the tactile surface may be present on only the major surface that forms the exterior surface of the enclosure.

As used herein, the term "anti-fingerprint" generally relates to a reduction in the visibility of fingerprints on a surface. Such reduction may be achieved by imparting hydrophobicity (i.e., contact angle of water>90°) to a surface, oleophilicity (i.e., contact angle of oil<90°) to a surface, and resistance to adherence of particulate or liquid matter found in fingerprints to a surface, or a combination thereof. In one or more embodiments, the reduction may be achieved by reducing the COF of the surface. In some embodiments, these properties may be imparted to a surface by various surface modifications, coatings or a combination thereof.

Substrate

The substrate may be sheet-like in form or may be shaped to have a 2.5-dimensional (as shown in FIG. 3) or 3-dimensional shape. In one more embodiments, the substrate may include an amorphous substrate, a crystalline substrate, or a combination thereof. In some embodiments, the substrate may be characterized as inorganic, or more specifically, glass-based. In one or more embodiments, the amorphous substrate may include a glass substrate, which may be strengthened or non-strengthened. Examples of suitable glass substrates include soda lime glass substrates, alkali aluminosilicate glass substrates, alkali containing borosilicate glass substrates and alkali aluminoborosilicate glass substrates. In some variants, the glass substrates may be free of lithia. In one or more alternative embodiments, the substrate 110 may include crystalline substrates such as glass-ceramic substrates (which may be strengthened or non-strengthened) or may include a single crystal structure, such as sapphire. In one or more specific embodiments, the substrate includes an amorphous base (e.g., glass) and a crystalline cladding (e.g., sapphire layer, a polycrystalline alumina layer and/or or a spinel ($MgAl_2O_4$) layer).

In some embodiments, the substrate 110 may be organic and may specifically be polymeric. Examples of suitable polymers include, without limitation: thermoplastics including polystyrene (PS) (including styrene copolymers and blends), polycarbonate (PC) (including copolymers and blends), polyesters (including copolymers and blends, including polyethyleneterephthalate and polyethyleneterephthalate copolymers), polyolefins (PO) and cyclicpolyolefins (cyclic-PO), polyvinylchloride (PVC), acrylic polymers including polymethyl methacrylate (PMMA) (including copolymers and blends), thermoplastic urethanes (TPU), polyetherimide (PEI) and blends of these polymers with each other. Other exemplary polymers include epoxy, styrenic, phenolic, melamine, and silicone resins.

The substrate may be substantially planar, although other embodiments may utilize a curved or otherwise shaped or sculpted substrate (e.g., having a 2.5-dimensional or 3-dimensional shape). The substrate may be substantially optically clear, transparent and free from light scattering. The substrate may have a refractive index in the range from about 1.45 to about 1.55. As used herein, the refractive index values are with respect to a wavelength of 550 nm. The substrate may be characterized as having a high average flexural strength (when compared to substrates that are not strengthened, as described herein) or high surface strain-to-failure (when compared to substrates that are not strengthened, as described herein) as measured on one or more major opposing surfaces of such substrates.

In one or more embodiments, the substrate may exhibit a color or may be a colored substrate (i.e., a substrate that appears to have a color or shade. Where glass-based substrates are utilized, the glass-based substrate may include a composition with a colorant such as oxides of cobalt, vanadium, copper, iron, manganese and the like.

Additionally or alternatively, the thickness of the substrate may vary along one or more of its dimensions for aesthetic and/or functional reasons. For example, the edges of the substrate may be thicker as compared to more central regions of the substrate. The length, width and thickness dimensions of the substrate may also vary according to the enclosure application or use.

The substrate may be provided using a variety of different processes. For instance, where the substrate includes a glass substrate, exemplary glass substrate forming methods include float glass processes and down-draw processes such as fusion draw and slot draw.

A glass substrate prepared by a float glass process may be characterized by smooth surfaces and uniform thickness is made by floating molten glass on a bed of molten metal, typically tin. In an example process, molten glass that is fed onto the surface of the molten tin bed forms a floating glass ribbon. As the glass ribbon flows along the tin bath, the temperature is gradually decreased until the glass ribbon solidifies into a solid glass substrate that can be lifted from the tin onto rollers. Once off the bath, the glass substrate can be cooled further and annealed to reduce internal stress.

Down-draw processes produce glass substrates having a uniform thickness that possess relatively pristine surfaces. Because the average flexural strength of the glass substrate is controlled by the amount and size of surface flaws, a pristine surface that has had minimal contact has a higher initial strength. When this high strength glass substrate is then further strengthened (e.g., chemically), the resultant strength can be higher than that of a glass substrate with a surface that has been lapped and polished. Down-drawn glass substrates may be drawn to a thickness of less than about 2 mm. In addition, down drawn glass substrates have a very flat, smooth surface that can be used in its final application without costly grinding and polishing.

The fusion draw process, for example, uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass substrate. The fusion draw method offers the advantage that, because the two glass films flowing over the channel fuse together, neither of the outside surfaces of the resulting glass substrate comes in contact with any part of the apparatus. Thus, the surface properties of the fusion drawn glass substrate are not affected by such contact.

The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous substrate and into an annealing region.

In some embodiments, the compositions used for the glass substrate may be batched with 0-2 mol. % of at least one fining agent selected from a group that includes $Na_2SO_4$, NaCl, NaF, NaBr, $K_2SO_4$, KCl, KF, KBr, and $SnO_2$.

Once formed, a glass substrate may be strengthened to form a strengthened glass substrate. It should be noted that glass ceramic substrates may also be strengthened in the same manner as glass substrates. As used herein, the term "strengthened substrate" may refer to a glass substrate or a glass ceramic substrates that has been chemically strengthened, for example through ion-exchange of larger ions for smaller ions in the surface of the glass or glass ceramic substrate. However, other strengthening methods known in the art, such as thermal tempering, may be utilized to form strengthened glass substrates.

The strengthened substrates described herein may be chemically strengthened by an ion exchange process. In the ion-exchange process, typically by immersion of a glass or glass ceramic substrate into a molten salt bath for a predetermined period of time, ions at or near the surface(s) of the glass or glass ceramic substrate are exchanged for larger metal ions from the salt bath. In one embodiment, the temperature of the molten salt bath is about 400-430° C. and the predetermined time period is about four to about eight hours. The incorporation of the larger ions into the glass or glass ceramic substrate strengthens the substrate by creating a compressive stress in a near surface region or in regions at and adjacent to the surface(s) of the substrate. A corresponding tensile stress is induced within a central region or regions at a distance from the surface(s) of the substrate to balance the compressive stress. Glass or glass ceramic substrates utilizing this strengthening process may be described more specifically as chemically-strengthened or ion-exchanged glass or glass ceramic substrates.

In one example, sodium ions in a strengthened glass or glass ceramic substrate are replaced by potassium ions from the molten bath, such as a potassium nitrate salt bath, though other alkali metal ions having larger atomic radii, such as rubidium or cesium, can replace smaller alkali metal ions in the glass. According to particular embodiments, smaller alkali metal ions in the glass or glass ceramic can be replaced by Ag+ ions. Similarly, other alkali metal salts such as, but not limited to, sulfates, phosphates, halides, and the like may be used in the ion exchange process.

The replacement of smaller ions by larger ions at a temperature below that at which the glass network can relax produces a distribution of ions across the surface(s) of the strengthened substrate that results in a stress profile. The larger volume of the incoming ion produces a compressive stress (CS) on the surface and tension (central tension, or CT) in the center of the strengthened substrate. Depth of exchange may be described as the depth within the strengthened glass or glass ceramic substrate (i.e., the distance from a surface of the glass substrate to a central region of the glass or glass ceramic substrate), at which ion exchange facilitated by the ion exchange process takes place. Maximum CT values are measured using a scattered light polariscope (SCALP) technique as known in the art.

Compressive stress (including surface CS) is measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

As used herein, DOC means the depth at which the stress in the chemically strengthened alkali aluminosilicate glass article described herein changes from compressive to tensile. DOC may be measured by FSM or SCALP depending on the ion exchange treatment. Where the stress in the glass article is generated by exchanging potassium ions into the glass article, FSM is used to measure DOC. Where the stress is generated by exchanging sodium ions into the glass article, SCALP is used to measure DOC. Where the stress in the glass article is generated by exchanging both potassium and sodium ions into the glass, the DOC is measured by SCALP, since it is believed the exchange depth of sodium indicates the DOC and the exchange depth of potassium ions indicates a change in the magnitude of the compressive stress (but not the change in stress from compressive to tensile); the exchange depth of potassium ions in such glass articles is measured by FSM.

In one embodiment, a strengthened glass or glass ceramic substrate can have a surface compressive stress of 300 MPa or greater, e.g., 400 MPa or greater, 450 MPa or greater, 500 MPa or greater, 550 MPa or greater, 600 MPa or greater, 650 MPa or greater, 700 MPa or greater, 750 MPa or greater or 800 MPa or greater. The strengthened glass or glass ceramic substrate may have a compressive depth of layer 15 µm or greater, 20 µm or greater (e.g., 25 µm, 30 µm, 35 µm, 40 µm, 45 µm, 50 µm or greater) and/or a central tension of 10 MPa or greater, 20 MPa or greater, 30 MPa or greater, 40 MPa or greater (e.g., 42 MPa, 45 MPa, or 50 MPa or greater) but less than 100 MPa (e.g., 95, 90, 85, 80, 75, 70, 65, 60, 55 MPa or less). In one or more specific embodiments, the strengthened glass or glass ceramic substrate has one or more of the following: a surface compressive stress greater than 500 MPa, a depth of compressive layer greater than 15 µm, and a central tension greater than 18 MPa.

Without being bound by theory, it is believed that strengthened glass or glass ceramic substrates with a surface compressive stress greater than 500 MPa and a compressive depth of layer greater than about 15 µm typically have greater strain-to-failure than non-strengthened glass or glass ceramic substrates (or, in other words, glass substrates that have not been ion exchanged or otherwise strengthened).

Example glasses that may be used in the substrate may include alkali aluminosilicate glass compositions or alkali aluminoborosilicate glass compositions, though other glass compositions are contemplated. Such glass compositions may be characterized as ion exchangeable. As used herein, "ion exchangeable" means that a substrate comprising the composition is capable of exchanging cations located at or near the surface of the substrate with cations of the same valence that are either larger or smaller in size. One example glass composition comprises $SiO_2$, $B_2O_3$ and $Na_2O$, where $(SiO_2+B_2O_3) \geq 66$ mol. %, and $Na_2O \geq 9$ mol. %. In an embodiment, the glass composition includes at least 6 wt. % aluminum oxide. In a further embodiment, the substrate includes a glass composition with one or more alkaline earth oxides, such that a content of alkaline earth oxides is at least 5 wt. %. Suitable glass compositions, in some embodiments, further comprise at least one of $K_2O$, MgO, and CaO. In a particular embodiment, the glass compositions used in the substrate can comprise 61-75 mol % SiO2; 7-15 mol % $Al_2O_3$; 0-12 mol % $B_2O_3$; 9-21 mol % $Na_2O$; 0-4 mol % $K_2O$; 0-7 mol % MgO; and 0-3 mol % CaO.

A further example glass composition suitable for the substrate comprises: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 ppm $As_2O_3$; and less than 50 ppm $Sb_2O_3$; where 12 mol % $\leq (Li_2O+Na_2O+K_2O) \leq 20$ mol % and 0 mol % $\leq$ (MgO+CaO) $\leq 10$ mol %.

A still further example glass composition suitable for the substrate comprises: 63.5-66.5 mol % $SiO_2$; 8-12 mol % $Al_2O_3$; 0-3 mol % $B_2O_3$; 0-5 mol % $Li_2O$; 8-18 mol % $Na_2O$; 0-5 mol % $K_2O$; 1-7 mol % MgO; 0-2.5 mol % CaO; 0-3 mol % $ZrO_2$; 0.05-0.25 mol % $SnO_2$; 0.05-0.5 mol % $CeO_2$; less than 50 ppm $As_2O_3$; and less than 50 ppm $Sb_2O_3$; where 14 mol % $\leq (Li_2O+Na_2O+K_2O) \leq 18$ mol % and 2 mol % (MgO+CaO) 7 mol %.

In a particular embodiment, an alkali aluminosilicate glass composition suitable for the substrate comprises alumina, at least one alkali metal and, in some embodiments, greater than 50 mol % $SiO_2$, in other embodiments at least 58 mol % $SiO_2$, and in still other embodiments at least 60 mol % $SiO_2$, wherein the ratio $((Al_2O_3+B_2O_3)/\Sigma modifiers)$ >1, where in the ratio the components are expressed in mol % and the modifiers are alkali metal oxides. This glass composition, in particular embodiments, comprises: 58-72 mol % $SiO_2$; 9-17 mol % $Al_2O_3$; 2-12 mol % $B_2O_3$; 8-16 mol % $Na_2O$; and 0-4 mol % $K_2O$, wherein the ratio $((Al_2O_3+B_2O_3)/\Sigma modifiers)$>1.

In still another embodiment, the substrate may include an alkali aluminosilicate glass composition comprising: 64-68 mol % $SiO_2$; 12-16 mol % $Na_2O$; 8-12 mol % $Al_2O_3$; 0-3 mol % $B_2O_3$; 2-5 mol % $K_2O$; 4-6 mol % MgO; and 0-5 mol % CaO, wherein: 66 mol % $\leq SiO_2+B_2O_3+CaO \leq 69$ mol %; $Na_2O+K_2O_3+B_2O_3+MgO+CaO+SrO>10$ mol %; 5 mol. % $\leq$ MgO+CaO+SrO $\leq 8$ mol %; $(Na_2O+B_2O_3)-Al_2O_3 \leq 2$ mol %; 2 mol % $Na_2O-Al_2O_3 \leq 6$ mol %; and 4 mol % $\leq (Na_2O+K_2O)-Al_2O_3 \leq 10$ mol %.

In an alternative embodiment, the substrate may comprise an alkali aluminosilicate glass composition comprising: 2 mol % or more of $Al_2O_3$ and/or $ZrO_2$, or 4 mol % or more of $Al_2O_3$ and/or $ZrO_2$.

Where the substrate includes a crystalline substrate, the substrate may include a single crystal, which may include $Al_2O_3$. Such single crystal substrates are referred to as sapphire. Other suitable materials for a crystalline substrate include polycrystalline alumina layer and/or or a spinel ($MgAl_2O_4$).

Optionally, the crystalline substrate may include a glass ceramic substrate, which may be strengthened or non-strengthened. Examples of suitable glass ceramics may include $Li_2O-Al_2O_3-SiO_2$ system (i.e. LAS-System) glass ceramics, $MgO-Al_2O_3-SiO_2$ System (i.e. MAS-System) glass ceramics, and/or glass ceramics that include a predominant crystal phase including β-quartz solid solution, β-spodumene ss, cordierite, and lithium disilicate. The glass ceramic substrates may be strengthened using the glass substrate strengthening processes disclosed herein. In one or more embodiments, MAS-System glass ceramic substrates may be strengthened in $Li_2SO_4$ molten salt, whereby $2Li^+$ for $Mg^{2+}$ exchange can occur.

The substrate according to one or more embodiments can have a thickness in the range from about 100 µm to about 5 mm. Example substrate thicknesses range from about 100 µm to about 500 µm (e.g., 100, 200, 300, 400 or 500 µm). Further example substrate thicknesses range from about 500 µm to about 1000 µm (e.g., 500, 600, 700, 800, 900 or 1000 µm). The substrate may have a thickness greater than about 1 mm (e.g., about 2, 3, 4, or 5 mm). In one or more specific embodiments, the substrate may have a thickness of 2 mm or less or less than 1 mm. The substrate may be acid polished or otherwise treated to remove or reduce the effect of surface flaws.

Tactile Surface

In one or more embodiments, substrate 101 comprises a tactile surface. In some embodiments, the tactile surface may comprise at least a portion of one or both major surfaces 110, 120 of the substrate 101 or one or more minor surfaces 130, 140 of the substrate. In some embodiments, the tactile surface may be formed on at least a portion of one, two, three or all of the surfaces of the substrate. In some instances, the tactile surface may be formed on all of one or more surfaces of the substrate 101. In FIG. 3, the tactile surface 150 is formed on major surface 120. In some embodiments, the tactile surface may be formed in a predetermined design. For example, the enclosure may include a design occupying a portion of a surface, and the tactile surface may be formed on the surface to cover or be disposed adjacent to the design. The design on the enclosure may be provided by a film disposed on one major surface of the substrate and the tactile surface may be formed on the opposite major surface, having the same shape as the design.

Figure 4:
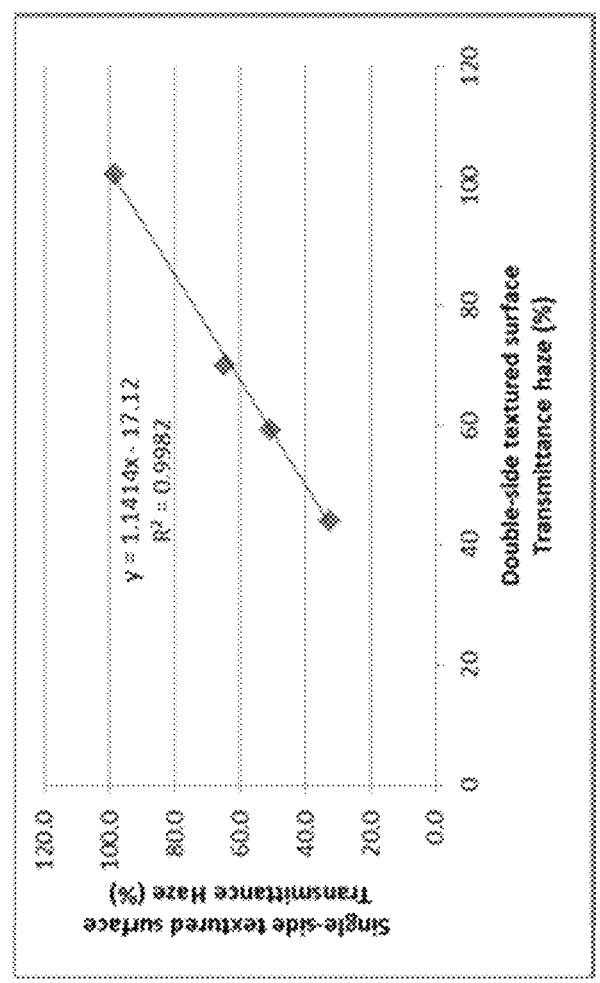
FIG. 4 is a graph showing the correlation of transmittance haze of an article including a tactile surface on a single surface or on opposing surfaces, based on Examples 1 and 2.

The tactile surface may include a textured surface (or surface that has been modified to include a texture), a coating, or a combination thereof (i.e., a coated textured surface). The substrate may exhibit certain properties as measured on the tactile surface. For example, in one or more embodiments, the substrate may exhibit a haze as measured at the tactile surface in the range from about 60% to about 120%, from about 65% to about 120%, from about 70% to about 120%, from about 75% to about 120%, from about 80% to about 120%, from about 90% to about 120%, from about 100% to about 120%, from about 100% to about 110%, from about 60% to about 110%, from about 60% to about 100%, from about 60% to about 90%, from about 60% to about 80%, or from about 60% to about 70%. The substrate may exhibit a transmittance haze as measured through the tactile surface of about 60% or greater, about 70% or greater, about 80% or greater, about 90% or greater, or about 95% or greater. The transmittance haze may be up to about 100%. In one or more embodiments, the substrate may exhibit a transmittance haze as measured through the tactile surface in the range from about 60% to about 100%, from about 65% to about 100%, from about 70% to about 100%, from about 75% to about 100%, from about 80% to about 100%, from about 90% to about 100%, from about 92% to about 100%, from about 93% to about 94%, from about 95% to about 100%, from about 96% to about 100%, from about 97% to about 100%, from about 98% to about 100%, from about 99% to about 100%, from about 60% to about 98%, from about 60% to about 96%, from about 60% to about 95%, from about 60% to about 94%, from about 60% to about 92%, from about 60% to about 90%, from about 60% to about 85%, or from about 60% to about 80%. In one or more embodiments, the substrate may exhibit a reflectance haze (as measured on the tactile surface) of about 60% or greater, about 70% or greater, about 80% or greater or about 90% or greater. In some instances, the reflectance haze may be up to about 100%. In one or more embodiments, the substrate may exhibit a reflectance haze as measured on the tactile surface in the range from about 60% to about 100%, from about 65% to about 100%, from about 70% to about 100%, from about 75% to about 100%, from about 80% to about 100%, from about 90% to about 100%, from about 92% to about 100%, from about 93% to about 94%, from about 95% to about 100%, from about 96% to about 100%, from about 97% to about 100%, from about 98% to about 100%, from about 99% to about 100%, from about 60% to about 98%, from about 60% to about 96%, from about 60% to about 95%, from about 60% to about 94%, from about 60% to about 92%, from about 60% to about 90%, from about 60% to about 85%, or from about 60% to about 80%. Reflectance haze may be measured at 2 degrees from specular or 5 degrees from specular. In some embodiments, haze may be measured according to ASTM E430 using a transparency meter such as the Haze-Gard meter supplied by BYK-Gardner GmbH, of Geretsried, Germany. The transmittance haze described herein may be influenced by whether the textures tactile surface is present on a single major surface or both major surfaces. FIG. 4 shows the correlation of transmittance haze of the substrate including a tactile surface only a single surface (typically a single major surface) or on opposing surfaces (typically, opposing major surfaces), based on Examples 1 and 2.

The substrate may exhibit a 20° distinctness of image (DOI) (as measured on the tactile surface) of about 90 or less (e.g., about 85 or less, about 80 or less, about 60 or less, or about 40 or less). As used herein, the term "distinctness of image" is defined by method A of ASTM procedure D5767 (ASTM 5767), entitled "Standard Test Methods for Instrumental Measurements of Distinctness-of-Image Gloss of Coating Surfaces," the contents of which are incorporated herein by reference in their entirety. In accordance with method A of ASTM 5767, substrate reflectance factor measurements are made on the anti-glare surface at the specular viewing angle and at an angle slightly off the specular viewing angle. The values obtained from these measurements are combined to provide a DOI value. In particular, DOI is calculated according to the equation $$DOI = \left[1 - \frac{Ros}{Rs}\right] \times 100, \qquad (3)$$

where Ros is the relative reflection intensity average between 0.2° and 0.4 away from the specular reflection direction, and Rs is the relative reflection intensity average in the specular direction (between +0.05° and −0.05°, centered around the specular reflection direction). If the input light source angle is +20° from the sample surface normal (as it is throughout this disclosure), and the surface normal to the sample is taken as 0°, then the measurement of specular reflected light Rs is taken as an average in the range of about −19.95° to −20.05°, and Ros is taken as the average reflected intensity in the range of about −20.2° to −20.4° (or from −19.6° to −19.8°, or an average of both of these two ranges). As used herein, DOI values should be directly interpreted as specifying a target ratio of Ros/Rs as defined herein. In some embodiments, the anti-glare surface has a reflected scattering profile such that >95% of the reflected optical power is contained within a cone of +/−10°, where the cone is centered around the specular reflection direction for any input angle.

In one or more embodiments, the substrate may exhibit a gloss at 60° of 70% or less (e.g., 65% or less, 50% or less, 40% or less, 30% or less or 20% or less), as measured on the tactile surface.

Unless otherwise stated, the DOI and gloss is measured on the tactile surface in reflected mode (i.e., without taking into account the other surfaces of the substrate). Transmission haze performance is in terms of the entire substrate, since these values are measured in the transmitted mode.

In embodiments that utilize a textured surface to form the tactile surface, the textured surface may include a plurality of features disposed on the surface that are light-scattering, create a roughness or a combination thereof. The features may be disposed directly on the surface or indirectly on the surface in a random or non-random manner. Randomly disposed features may provide a smooth touch-feeling when the surface is contacted or swiped with a finger or skin. Specifically, features imparting a degree of roughness can create a smooth touch-feeling that facilitates gliding of fingers or other objects over the surface by limiting the contact area of the finger or object with the textured surface.

In some embodiments, the plurality of features may exhibit a longest cross-sectional dimension (i.e., the largest feature may have a longest cross-sectional dimension) in the range from about 5 micrometers to about 100 micrometers. Such dimensions may be found in a sample surface section having dimensions of about 0.5 mm by 0.5 mm to capture a representative average including a number of typical surface features in the range from about 10 to about 1000. For example, the features may have a longest cross-sectional dimension in the range from about 5 micrometers to about 90 micrometers, from about 5 micrometers to about 80 micrometers, from about 5 micrometers to about 70 micrometers, from about 5 micrometers to about 60 micrometers, from about 5 micrometers to about 50 micrometers, from about 5 micrometers to about 40 micrometers, from about 5 micrometers to about 30 micrometers, from about 10 micrometers to about 100 micrometers, from about 15 micrometers to about 100 micrometers, from about 20 micrometers to about 100 micrometers, from about 30 micrometers to about 100 micrometers, or from about 10 micrometers to about 50 micrometers. The features may include an average longest cross-sectional dimension that is about 2 times or more than the longest cross-sectional dimension of any one feature. The features may include an average longest cross-sectional dimension that is about 2 times or less than the longest cross-sectional dimension of any one feature. The longest cross-sectional dimension of the features may be evaluated by optical microscope under 200× magnification. To determine the average longest cross-sectional dimension of the features, ten of the largest features are selected over a sample surface section having dimensions of about 0.5 mm by 0.5 mm, and measured by optical microscope. The average measurement is reported as the average longest cross-sectional dimension of the selected features.

In one or more embodiments, the textured surface may exhibit a RMS roughness height (i.e., in the z-direction) in the range from about 0.02 micrometers to about 10 micrometers, from about 0.02 micrometers to about 8 micrometers, from about 0.02 micrometers to about 6 micrometers, from about 0.02 micrometers to about 4 micrometers, from about 0.05 micrometers to about 2 micrometers, from about 0.05 micrometers to about 1 micrometer, or from about 0.1 to about 0.8 micrometers. The RMS roughness height is measured using methods known in the art such as atomic force microscopy (AFM), stylus contact profilometry, and optical interference profilometry. The RMS roughness as described herein is measured over a sample surface section having dimensions of 0.5 mm by 0.5 mm.

In some embodiments, the textured surface may exhibit a surface roughness Ra measuring the vertical height of the features (e.g., as measured in the z-direction by an optical surface profiler, such as the 3D Optical Surface Profiler available from Zygo Corporation) in the range from about 500 nm or greater. In some instances, the surface Ra may be in the range from about 500 nm to about 2000 nm, from about 500 nm to about 1800 nm, from about 500 nm to about 1600 nm, from about 500 nm to about 1500 nm, from about 500 nm to about 1400 nm, from about 500 nm to about 1200 nm, from about 500 nm to about 1000 nm, from about 600 nm to about 2000 nm, from about 800 nm to about 2000 nm, from about 900 nm to about 2000 nm, from about 1000 nm to about 2000 nm, from about 1100 nm to about 2000 nm, from about 1200 nm to about 2000 nm, or from about 900 nm to about 1300 nm. The surface Ra roughness as described herein is measured over a sample surface section having dimensions of about 0.5 mm by 0.5 mm.

In some embodiments, the textured surface may include a low frequency of features, large sized features, or a combination thereof which cause fingerprint oils to collect in between the features (i.e., in the valleys created between the features) of the textured structure. Collection of oils between the features reducing the fraction of the surface that is covered with oil droplets, thus reducing light scattering from the fingerprint oils. In such embodiments, the textured surface may have an RMS roughness height in the range from about 0.05 micrometers to about 1 micrometer over a samples size having dimensions of about 0.5 mm by 0.5 mm.

In some embodiments, the textured surface may have a RMS roughness height that is large enough to significantly reduce transfer of fingerprint oils into the valleys of the structure, thus also reducing light scattering through limiting the fraction of the surface that is covered with oil droplets. Such textured surfaces may have a RMS roughness height in the range from about 1 micrometer to about 10 micrometers over a samples size having dimensions of about 0.5 mm by 0.5 mm.

In some embodiments, the textured surface comprises a lateral spatial period (i.e., in the x-y in-plane direction) in the range from about 0.1 micrometers to about 500 microns, from about 0.1 micrometers to about 400 microns, from about 0.1 micrometers to about 300 microns, from about 0.1 micrometers to about 200 microns, from about 0.1 micrometers to about 100 microns, from about 0.1 micrometers to about 50 microns, from about 0.1 micrometers to about 10 microns, from about 0.5 micrometers to about 500 microns, from about 1 micrometer to about 500 microns, from about 10 micrometers to about 500 microns, from about 50 micrometers to about 500 microns, from about 100 micrometers to about 500 microns, from about 1 micrometer to about 100 micrometers, or from about 10 micrometers to about 50 micrometers. Such lateral special period ranges are measured over a samples size having dimensions of about 1 mm by 1 mm.

These roughness parameters and surface profiles can be measured using known techniques such as atomic force microscopy (AFM), stylus contact surface profilometry, or optical interference surface profiling.

The textured surface may be formed by a variety of methods such as wet etching, dry etching, masking and etching, photolithography, and the like. In some embodiments, the textured surface may be formed by chemical etching at least one surface of the substrate. Chemical etching may include applying a mask on selected portions of the surface and removing the exposed portions of the surface by etching sand blasting or grinding. In some embodiments, the mask may be formed by forming precipitates on the surface. In other embodiments, the masking may be achieved by polymer masking, polymer particle masking, or ink-jetting a mask, or may utilize a mask formed by photolithography or nanoimprint lithography, a phase-separating polymer mask, a soluble (organic or inorganic) phase embedded in an insoluble polymer mask, an insoluble polymer mask including particles embedded therein or a combination thereof. Where etching is used, the etchants may comprise hydrofluoric acid or hydroxide material such as KOH or NaOH plus chelating agents. Hydrofluoric acid may be combined with other acids such as hydrochloric, sulfuric, acetic, or nitric acids, where minimizing the formation of precipitate formation is desired and/or where etching the surface of the substrate without changing the resulting surface composition is desired. In some embodiments, enclosures with a textured surface may be formed into different shapes through polishing or hot-forming, which may be performed either before or after the texturing process. In other embodiments, an enclosure with a textured surface may be strengthened (as described below) after the textured surface is formed.

In one or more embodiments, the textured surface may be formed by adding features to the surface of the substrate (especially in the case of organic substrates). The features may include particles that are attached or bonded to the surface. In some embodiments, an adhesive may be utilized to bond the particles to the surface. In other embodiments, the particles may be directly bonded to the surface. The particles may have an average major dimension in the range from 5 micrometers to about 100 micrometers. The particles may be formed from the same material as the substrate, or from a different material.

In one or more embodiments, the textured surface may include a coating or coatings disposed on the textured surface, forming a coated textured surface. The coatings may be placed on top of the textured surface to provide various functionalities. The coatings may include ink coatings, hard coatings, scratch-resistant coatings, low-friction coatings, high-friction coatings, oleophobic coatings, oleophilic coatings, hydrophobic coatings, hydrophilic coatings, coatings that exhibit hydrophobicity and oleophobicity, reflective or anti-reflective coatings, or easy-to-clean coatings that show a combination of these functions. The specific choice of coating depends on the desired uses of the electronic device, as well as design considerations. In some cases the coatings may be relatively thick (e.g., in the range from about 1 micrometer to about 3 micrometers, in the case of scratch-resistant coatings), or may be relatively thin (e.g., in the range from about 0.5 nanometers to about 50 nanometers, in the case of hydrophobicity and oleophobicity coatings, oleophobic coatings or oleophilic coatings).

In one or more embodiments, the textured surface imparts oleophilicity or hydrophobicity and oleophobicity to the substrate surface (without a coating disposed thereon) and thus forms a tactile surface that exhibits anti-fingerprint properties or performance. In one or more embodiments, the textured surface enhances or promotes the oleophilicity or hydrophobicity and oleophobicity of certain substrate, such as glass and some glass ceramic substrates. Without being bound by theory, it is believed that this enhanced oleophilicity or hydrophobicity and oleophobicity provides anti-fingerprint functionality because the visibility of a fingerprint on a surface is largely determined by light scattering, and in turn this light scattering is largely dependent on the size of the scattering oil droplets left behind by a fingerprint. Oleophobic surfaces or hydrophobic and oleophobic surfaces, such as those commonly used in non-textured display cover substrates, tend to create a large number of fingerprint droplets having an average longest cross-sectional dimension of 2 micrometers or less, as measured by optical or other known means for measuring such droplets. Such droplets are highly light scattering droplets and thus increase the visibility of the fingerprint. In contrast, oleophilic surfaces tend to create smears or very broad droplets that are larger than 5 micrometers in size, with much reduced light scattering, particularly at scattering angles greater than about 5 degrees away from the specular reflection angle. Accordingly, it is believed a textured surface exhibiting oleophilicity provides improved anti-fingerprint performance.

In some embodiments, the textured surface includes a coating. In one or more embodiments, the coating is a low-friction coating or a coating that reduces COF of the textured surface. In one or more embodiments, the coating is also at least somewhat oleophilic, to form an oleophilic coated textured surface or a hydrophobic and oleophobic coated textured surface. Such coated textured surfaces can provide a smooth gliding surface for fingers. In one or more embodiments, such coated textured surfaces can provide some spreading of oil droplets to further minimize light scattering. In some examples, coated textured surfaces including a low-friction coating exhibit a kinetic coefficient of friction (COF) of less than 0.3, when measured by the COF Test Method (described herein). In some examples, coated textured surfaces including a low-friction coating exhibit a static COF of less than 0.3, as measured by the COF Test Method. Examples of low-friction coatings may include glass surface reactive porous alkyl siloxanes (e.g., methyl siloxane, ethyl siloxane, propyl siloxane, and the like), porous phenyl siloxanes, porous alkyl silanes, inorganic coatings (such as alumina, titania, zirconia, aluminum titanium nitride) or combinations thereof. In one or more alternative embodiments, the textured surface may include a high-friction coating forming a coated textured surface. Examples of such high-friction coatings include alkyl siloxanes (e.g., methyl siloxane, ethyl siloxane, propyl siloxane, and the like), phenyl siloxanes, alkyl silanes and other similar materials.

Figure 5:
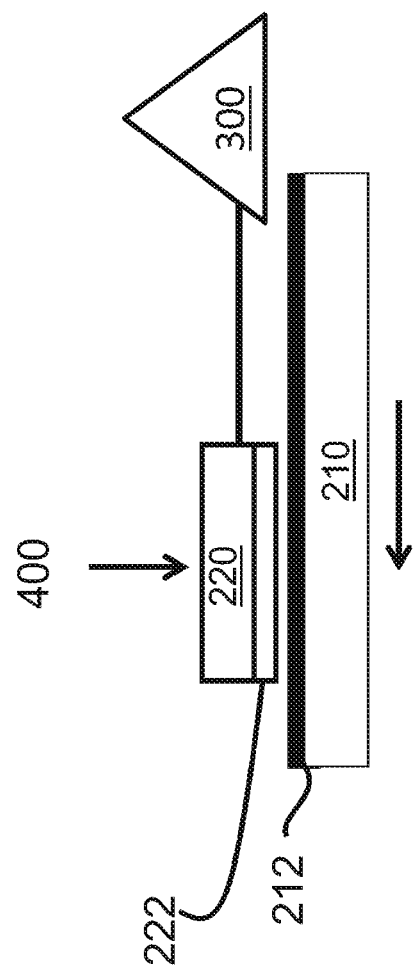
FIG. 5 is a schematic illustration of the COF Test Method.

As used herein, the COF Test Method is used to measure static and kinetic COF using a coefficient of friction instrument (COF-1000) supplied by ChemInstruments, Inc. of Fairfield, Ohio, coupled with data management software. Measurements were obtained using a 200 g or 500 g load applied at 12 inches/minute. Unless specified otherwise, the samples measured had dimensions of 65 mm by 135 mm, and were attached to the moving substrate by means of a clip. The test material included a microfiber cloth supplied by Photodon, LLC of Traverse City, Mich. under the trade name 382ZZ and having zigzag edges with dimensions 7 inches by 6 inches. The cloth comprises 80% polyester, 20% nylon and has a density of 260 grams/m$^2$. Cloth was cut into squares having dimensions of 2 inches by 2 inches and affixed to a test glass substrate by double sided tape. The test apparatus is illustrated in FIG. 5, which shows the substrate 212 (with the tactile surface) be tested affixed to a moving substrate 210. The cloth 222 is shown affixed to a test glass substrate 220. The cloth 222 and test glass substrate 220 are coupled to the coefficient of friction instrument 300. The tactile surface faces the cloth 222 so the COF of the surface can be measured.

In one or more embodiments, the tactile surface is substantially free of a coating (e.g., free of an oleophilic coating) and may exhibit a static or kinetic COF of less than 0.5, when measured under the COF Test Method using a load of 500 g. In some embodiments, the tactile surface is substantially free of a coating (e.g., free of an oleophilic coating) and may exhibit a static or kinetic COF of in the range from about 0.05 to about 0.4, 0.05 to about 0.3, 0.05 to about 0.2, 0.1 to less than 0.5, 0.15 to less than 0.5, or 0.2 to less than 0.5. In one or more embodiments, the tactile surface may include a low-friction coating and exhibits the static or kinetic COF disclosed herein.

In some instances, a bare tactile surface (without any coating) exhibits an oleophilicity that decreases with use, as oils, dirt and fingerprints accumulate on the textured surface. In some embodiments, the textured surface includes a coating that maintains a certain degree of oleophilicity. Such coatings can include $TiO_2$, which is believed to be a "self-cleaning" material after exposure to ultraviolet light. Specifically, $TiO_2$ coatings can chemically break down absorbed oils and dirt after exposure to ultraviolet light or even sunlight through photocatalysis.

Enclosures according to one or more embodiments may be free of a textured surface but include a coating forming the anti-fingerprint surface. Such coatings impart oleophilicity or hydrophobicity and oleophobicity to the surface.

In one or more embodiment, the tactile surface exhibits an anti-fingerprint functionality such that, after a wipe of a finger or other applicator containing oil or oleic acid, the surface includes droplets that have an average major dimension of greater than about 2 micrometers, greater than about 5 micrometers, or greater than about 10 micrometers.

The visibility, based on brightness, may be calculated by the following equation, where the subscript 1 indicates an area including a fingerprint and subscript 2 indicates an area without a fingerprint: the absolute value of the difference ($brightness_1-brightness_2$), divided by the sum ($brightness_1+brightness_2$). In some embodiments, the texture surface exhibits a visibility of less than about 0.99, less than about 0.95, less than about 0.8, less than about 0.7, less than about 0.6, less than 0.5, less than 0.25, less than 0.2, less than 0.1, less than 0.05 at certain selected angles.

Enclosure

In one or more embodiments, the enclosure may be transparent, translucent, or opaque. In embodiments of a transparent enclosure, such enclosures may exhibit an average total transmittance (taking into account both the interior and exterior surface of the enclosure of about 80% or greater, 85% or greater, 90% or greater, or 95% or greater, over the visible spectrum. In some instances, the enclosure may exhibit an average total transmittance in the range from about 80% to about 96%, from about 80% to about 94%, or from about 80% to about 92%, over the visible spectrum. As used herein, the term "transmittance" is defined as the percentage of incident optical power within a given wavelength range transmitted through a material (e.g., the enclosure or portions thereof). Transmittance is measured using a specific line width. In one or more embodiments, the spectral resolution of the characterization of the transmittance is less than 5 nm or 0.02 eV. As used herein, the "visible spectrum" includes the wavelength range from about 420 nm to about 700 nm.

In one or more embodiments, the enclosure also exhibits 4-point bend strength, stiffness or Young's Modulus, hardness, crack indentation threshold, thermal conductivity, and strength (in terms of depth of compressive layer (DOC), surface compressive stress and central tension).

In one or more embodiments, the enclosure may include the substrate described herein. The substrate may form the entire enclosure or a portion of the enclosure.

In one or more embodiments, the enclosure permits transmission of wireless data transmission or wireless charging energy. In some embodiments, the enclosure exhibits both radio and microwave frequency transparency, as defined by a loss tangent of less than 0.03 and at a frequency range of between 15 MHz to 3.0 GHz. In another exemplary embodiment the article, particularly the electronic device enclosure exhibits radio and microwave frequency transparency, as defined by a loss tangent of less than 0.015 over the frequency range of between 500 MHz to 3.0 GHz. This radio and microwave frequency transparency feature is especially important for wireless hand held devices that include antennas internal to the enclosure. This radio and microwave transparency allows the wireless signals to pass through the enclosure and in some cases enhances these transmissions. Furthermore, it may also be desirable to be transparent in the infrared to allow wireless optical communication between electronic devices; specifically an infra-red transparency of greater than 80% at wavelengths in the range from about 750 to about 2000 nm. In other embodiments, the enclosure is permits transmission of magnetic fields and/or inductive fields.

The enclosure may also exhibit various mechanical attributes for use with portable electronic devices. For example, some embodiments of the enclosure exhibit any one or more of: a fracture toughness of greater than 0.6 $MPa·m^{1/2}$, a 4-point bend strength of greater than 350 MPa, a Vickers hardness of at least 600 $kgf/mm^2$ and a Vickers median/radial crack initiation threshold of at least 5 kgf, a Young's Modulus in the range from about 50 GPa to about 100 GPa, a thermal conductivity of less than 2.0 W/m° C. In some embodiments, the enclosure exhibits a combination of fracture toughness in excess of 0.6 $MPa·m^{1/2}$, the above-recited Vickers hardness/indentation threshold, and 4-point bend strength. In one or more embodiments, the enclosure exhibits a fracture toughness of greater than 0.70 $MPa·m^{1/2}$, and an 4-point bend strength of greater than 475 MPa or greater than 525 MPa and a Young's Modulus in the range from about 50 GPa to about 75 GPa.

The enclosure described herein may deform upon indentation primarily by densification rather than by shear faulting. In some embodiments, the enclosure is free of subsurface faulting and radial cracks upon deformation. In some embodiments, such as when the substrate utilized is strengthened, the resulting enclosure is more resistant to crack initiation by shear faulting. In one embodiment, the enclosure comprises a strengthened substrate and exhibits a Vickers median/radial crack initiation threshold of at least 5 kilogram force (kgf). In a second embodiment, the enclosure has a Vickers median/radial crack initiation threshold of at least about 10 kgf or at least about 30 kgf.

In one or more embodiments, the enclosure exhibits a thermal conductivity of less than 2 W/m° C., and thus, remains cool to the touch even in high operating temperatures (e.g., temperatures approaching 100° C.). In some embodiments, the enclosure exhibits a thermal conductivity of less than 1.5 W/m° C. For comparison, ceramics such as alumina may exhibit thermal conductivities as high as 29 W/m° C.

EXAMPLES

Various embodiments will be further clarified by the following examples.

Example 1

Alkali aluminosilicate glass substrates (having a sheet form a and which were not strengthened) having a nominal composition of 57.5 mol % $SiO_2$, 16.5 mol % $Al_2O_3$, 16 mol % $Na_2O$, 2.8 mol % MgO and 6.5 mol % $P_2O_5$, and a thickness of 0.7 mm were cleaned by immersing in detergent solution and applying ultrasonic agitation to the detergent solution. The cleaned substrates were then removed from the detergent solution and then statically etched by applying an etchant including 6 weight percent hydrofluoric acid (HF) and 15 weight percent $NH_4F$ for 8 minutes (Step A). The etched substrates were then rinsed and thoroughly with DI water. The etched substrates were then were dipped in a solution of 5 wt % HF for the durations indicated in Table 1 to achieve the desired haze level (Step B). After the second etching step, the glass substrates were cleaned by DI water to remove acid residue and any etch byproduct. Resulting substrates (Examples 1A-1K) included textured surface on both major surfaces and both minor surfaces. One glass substrate was not subjected to any etching steps (Comparative Example 1L). The transmittance haze, transmittance, final substrate thickness, longest cross-sectional dimension of the largest feature, and surface roughness (Ra) were measured on the major surfaces of resulting Examples 1A-1K and Comparative Example 1L.

TABLE 1

Properties for Examples 1A-1K and Comparative Example 1L, based on etching times.

| Ex. | Etching Time (min) Step A | Etching Time (min) Step B | Haze (%) | Transmittance (%) | Final substrate thickness (mm) | Approximate longest cross-sectional dimension of largest feature (micrometers) | Surface roughness Ra (nm) |
|---|---|---|---|---|---|---|---|
| 1A | 8 | 0 | 109 | 82.8 | 0.699 | n/a | 1216 |
| 1B | 8 | 2 | 104 | 90.8 | 0.676 | 18.3 | |
| 1C | 8 | 3.1 | 101 | 90.7 | 0.665 | 22.1 | 998 |
| 1D | 8 | 4.5 | 95 | 90.5 | 0.652 | 25.4 | |
| 1E | 8 | 5.8 | 91 | 90.9 | 0.646 | 28.8 | |
| 1F | 8 | 7.1 | 88 | 90.9 | 0.633 | 30.6 | |
| 1G | 8 | 8.4 | 82 | 91.1 | 0.618 | 31 | 773 |
| 1H | 8 | 9.8 | 78 | 91.3 | 0.605 | 34.3 | |
| 1I | 8 | 11.1 | 70 | 91.4 | 0.592 | 35.5 | |
| 1J | 8 | 13.7 | 60 | 92.3 | 0.571 | 39 | |
| 1K | 8 | 16.4 | 50 | 92.8 | 0.552 | 47.33 | 605 |
| Comp. 1L | n/a | n/a | 0 | 93.0 | 0.705 | n/a | |

Figure 6:
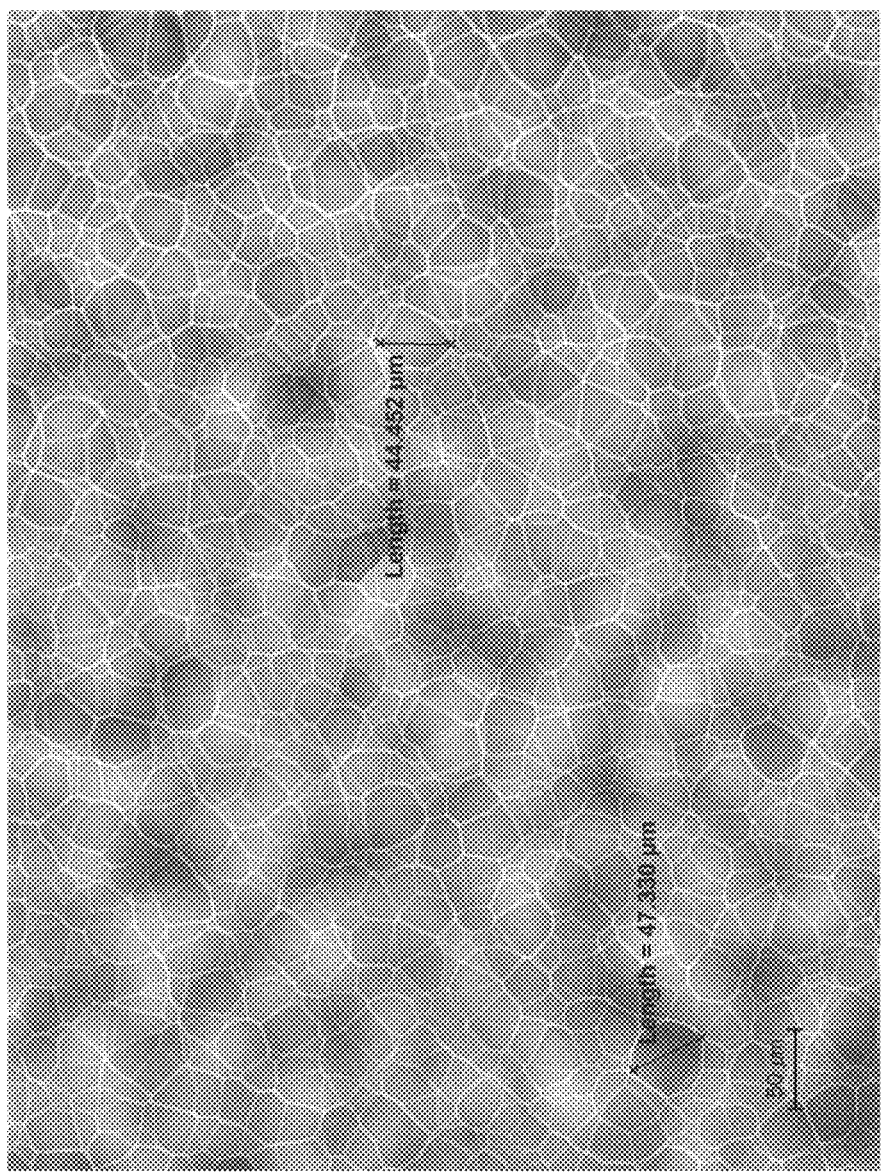
FIG. 6 is an optical microscope image of Example 1K.
Figure 7A:
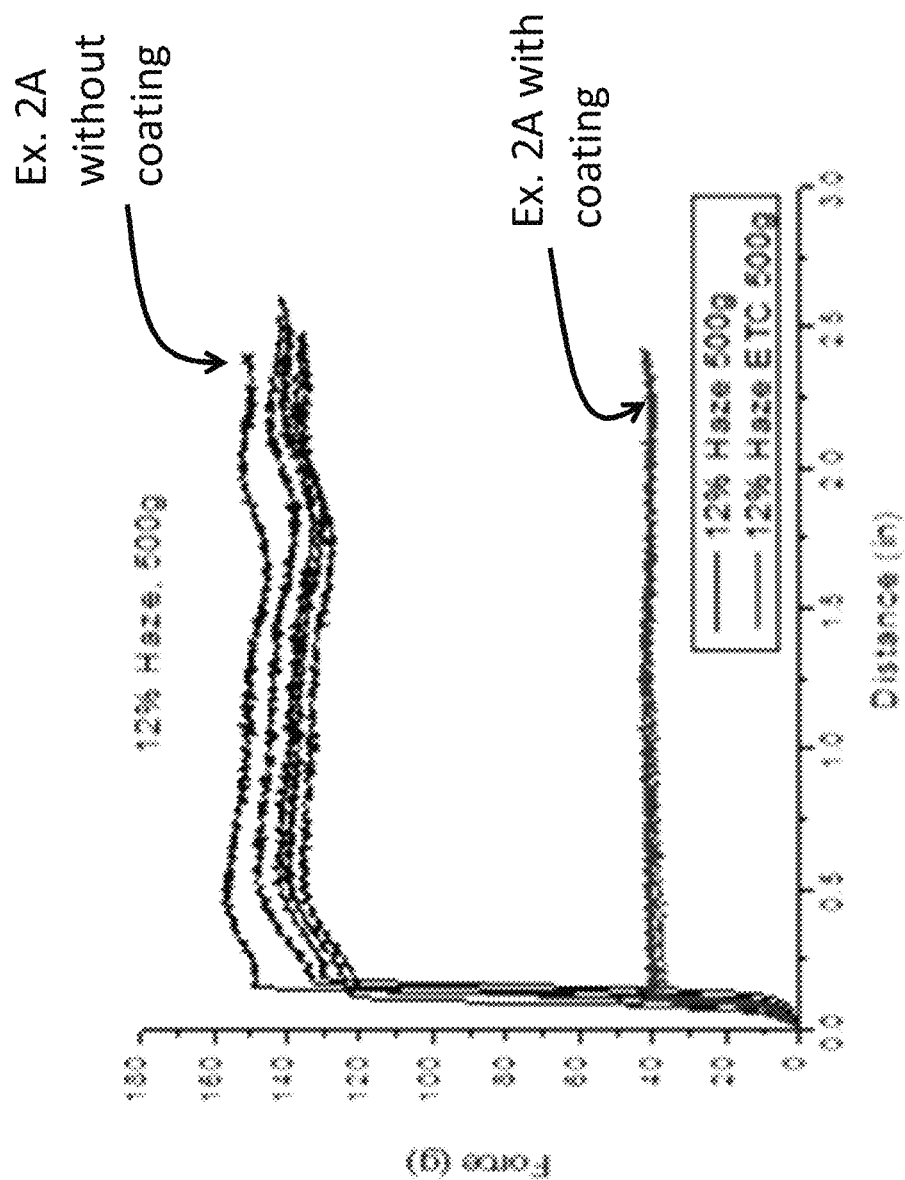

FIG. 6 shows an optical microscope image of Example 1K taken at 200× magnification. The largest lateral features had a longest cross-sectional dimension of about 44.452 micrometers and 47.330 micrometers (a 50 micrometer scale is included for reference).

Example 2

Alkali aluminosilicate glass substrates (having a sheet form a and which were not strengthened) having the same nominal composition as Example 1 and identical thicknesses were cleaned by immersing in detergent solution and applying ultrasonic agitation to the detergent solution. The cleaned substrates were then removed from the detergent solution. A single major surface was coated with an etch-resistant film and then statically etched by applying an etchant including 2 weight percent or 6 weight percent hydrofluoric acid (HF) and 15 weight percent or 30 weight percent $NH_4F$ for 8 minutes (Step C). The etched substrates were then rinsed and thoroughly with DI water. The etched substrates were then were dipped in a solution of 5 wt % HF for the durations indicated in Table 2 to achieve the desired haze level (Step D). After the second etching step, the glass substrates were cleaned by DI water and the acid-resistant film is removed. Resulting Examples 2A-2E included a textured surface on a single major surface, and both minor surfaces. The opposing major surface was free of a textured surface. The transmittance haze, DOI, Gloss at 60°, surface roughness (Ra), and average longest cross-sectional dimension of the features, were measured on the textured major surface of resulting Examples 2A-2E.

TABLE 2

Properties for Examples 2A-2E, based on etching times.

| Ex. | Etching Time (min) Step A | Etching Time (min) Step B | Haze (%) | DOI (%) | Gloss at 60° (%) | Surface roughness Ra (nm) | Average longest cross-sectional dimension of the features (μm) |
|---|---|---|---|---|---|---|---|
| 2A | 8 (3 wt % HF/30 wt % $NH_4F$) | | 10.6 | 12.8 | 92.4 | 63.1 | 227 | 21 |
| 2B | 8 (6 wt % HF/15 wt % $NH_4F$) | | 16.4 | 33.2 | 1.1 | 22.6 | 583 | 37 |
| 2C | 8 (6 wt % HF/15 wt % $NH_4F$) | | 10 | 49.5 | 0.8 | 16.4 | 610 | 34 |
| 2D | 8 (6 wt % HF/15 wt % $NH_4F$) | | 8.4 | 61.5 | 1.0 | 14.8 | 760 | 32 |
| 2E | 8 (6 wt % HF/15 wt % $NH_4F$) | | 2 | 97.6 | 0.0 | 11.9 | 1113 | n/a |

The static COF of Examples 2A-2E was measured (as described herein) before and after coating with an easy-to-clean coating, as shown in Table 3. The easy-to-clean coating (imparting hydrophobicity and oleophobicity to the surface) included an alkoxysilane functional perfluoropolyether (PFPE) hybrid polymer supplied by Dow Corning Corporation of Midland, Mich., under the trade name Dow Corning 2634, and hydrofluoroether solvent supplied by The 3M Company of Minneapolis, Minn., under the trade name 3™ Novec™ 7200 Engineered Fluid. The easy-to-clean coating was prepared by combining 4.2 mL of the alkoxysilane functional perfluoropolyether (PFPE) hybrid polymer and 1 L of the hydrofluorether solvent and sprayed using a spray applicator supplied by Nordson ASYMTEK of Carlsbad, Calif., under the trademark SC-300 Swirl Coat®, using a valve supplied by Nordson EFD of East Providence, R.I., under the trade name MM781-SYS MicroMark. The coating was applied using a 2.5 mL/minute flow rate, at 30 psi air pressure, 20 inch/minute velocity for 2 hours in an environment at 50° C. and 50% relative humidity. Any excess applied easy-to-clean coating was then wiped off using an isopropyl alcohol wipe.

| Ex. | COF without coating | COF after coating | Haze |
|-----|---------------------|-------------------|------|
| 2A  | 0.28                | 0.09              | 12%  |
| 2B  | 0.24                | 0.11              | 32%  |
| 2C  | 0.25                | 0.13              | 51%  |
| 2D  | 0.28                | 0.20              | 65%  |
| 2E  | 0.48                | 0.43              | 99%  |

FIGS. 7A-7E show the impact of easy-to-clean (ETC) coating on coefficient of friction (COF) for the different haze and roughness levels of Examples 2A-2E. The COF was measured five times on the same Example using a 500 g load. As shown in FIGS. 7A-7E, the ETC coating was more effective in reducing the COF when the surface roughness (and haze) is low, and became less effective as surface roughness (and haze) increased.

FIG. 8 shows the static COF of Examples 2B-2E as a function of transmittance haze. The results showed that the application of an ETC coating was more effective in reducing the COF when the surface roughness (and haze) is low, and became less effective as surface roughness (and haze) increased.

Example 3

Glass substrates having the same nominal composition as Example 1 and identical shape and thickness were sandblasted at a pressure of 20 psi with SiC particles to create a textured surface exhibiting high transmittance haze and roughness. The substrates were then rinsed with DI water to remove any debris from sandblasting. The substrates where then chemically polished using a 5 weight percent HF solution for various times (as indicated in Table 4) and then rinsed in DI water again. Resulting Examples 3A-3D included a textured surface on a single major surface. The opposing major surface was free of a textured surface. The transmittance haze, and surface roughness (Ra), were measured on the textured surface of resulting Examples 3A-3D.

TABLE 4

Properties for Examples 3A-3D, based on chemical polishing time.

| Transmittance Haze (%) | Surface Roughness (nm) | Chemical Polishing time in 5 wt % HF (min) |
|------------------------|------------------------|---------------------------------------------|
| 90+%                   | 1460                   | 0                                           |
| 90+%                   | 1941                   | 2                                           |
| 90+%                   | 2405                   | 4                                           |
| 90+%                   | 2367                   | 8                                           |

Various modifications and variations can be made to the materials, methods, and articles described herein. Other aspects of the materials, methods, and articles described herein will be apparent from consideration of the specification and practice of the materials, methods, and articles disclosed herein. It is intended that the specification and examples be considered as exemplary. Exemplary embodiments include the following.

Embodiment 1. An electronic device comprising: an enclosure, and electrical components disposed at least partially inside the enclosure, the electronic components comprising a controller, a memory, and a display, wherein the enclosure comprises a substrate, and the substrate comprises
an average transmittance of about 80% or greater over the visible spectrum;
a static coefficient of friction less than about 0.3,
a surface roughness Ra of about 500 nm or greater, and either one or both
a transmission haze greater than about 60%, and
a reflection haze at either 2 degrees from specular or 5 degrees from
specular greater than 60%.

Embodiment 2. The electronic device of embodiment 1, wherein the substrate comprises an amorphous substrate or a crystalline substrate.

Embodiment 3. The electronic device of embodiment 2, wherein the substrate is amorphous and comprises any one of a soda lime glass, an alkali aluminosilicate glass, an alkali containing borosilicate glass and an alkali aluminoborosilicate glass.

Embodiment 4. The electronic device of embodiment 2 or embodiment 3, wherein the substrate is amorphous and is strengthened.

Embodiment 5. The electronic device enclosure of any one of embodiments 2-4, wherein the substrate is amorphous and further comprises any one or more of
a compressive surface layer having a depth of layer (DOC) greater than or equal to 20 μm,
a surface compressive stress greater than 400 MPa, and
a central tension of more than 20 MPa.

Embodiment 6. The electronic device enclosure of embodiment 2, wherein the substrate is crystalline and comprises a strengthened glass ceramic substrate, a non-strengthened glass-ceramic, or a single crystal substrates.

Embodiment 7. The electronic device of any one of the preceding embodiments, wherein the substrate comprises an ink layer disposed a major surface of the substrate.

Embodiment 8. The electronic device of any one of the preceding embodiments, wherein the substrate comprises a colored glass.

Embodiment 9. The electronic device of any one of the preceding embodiments, wherein the transmission haze is greater than about 90%.

Embodiment 10. The electronic device of any one of the preceding embodiments, wherein the reflection haze at either 2 degrees from specular or 5 degrees from specular is greater than about 90%, as measured by ASTM E430.

Embodiment 11. The electronic device of any one of the preceding embodiments, further comprising a layer of hydrophobic material, oleophobic material or hydrophobic and oleophobic material.

Embodiment 12. The electronic device of any one of the preceding embodiments, wherein the Ra surface roughness is about 700 nm or greater.

Embodiment 13. The electronic device of any one of the preceding embodiments, wherein the substrate further comprises a tactile surface, the tactile surface comprising a plurality of features having a longest cross-sectional dimension in the range from about 10 micrometers to about 50 micrometers.

Embodiment 14. The electronic device of embodiment 13, wherein the plurality of features comprise an average longest cross-sectional dimension is about 2 times or greater than the longest cross-sectional dimension.

Embodiment 15. The electronic device of embodiment 13, wherein the plurality of features comprises an average longest cross-sectional dimension is about 2 times or less than the longest cross-sectional dimension.

Embodiment 16. The electronic device of any one of the preceding embodiments, further comprising an electronic device selected from a mobile phone, a tablet, a laptop, and a media player.

Embodiment 17. A substrate comprising:
first and second opposing major surfaces;
first and second opposing minor surfaces;
a tactile surface disposed on the first major surface, the tactile surface comprising a plurality of features having a longest cross-sectional dimension in the range from about 10 micrometers to about 50 micrometers.
wherein the substrate comprises:
an average transmittance of about 80% or greater over the visible spectrum;
a coefficient of friction less than about 0.3, and
a surface roughness Ra of about 500 nm or greater,
either one or both
a transmission haze greater than about 60%, and
a reflection haze at either 2 degrees from specular or 5 degrees from
specular greater than 60%.

Embodiment 18. The substrate of embodiment 17, wherein the plurality of features comprises an average longest cross-sectional dimension greater than or equal to about 2 times the longest cross-sectional dimension.

Embodiment 19. The substrate of embodiment 17, wherein the plurality of features comprises an average longest cross-sectional dimension less than or equal to about 2 times than the longest cross-sectional dimension.

Embodiment 20. The substrate of any one of embodiments 17-19, wherein the substrate comprises an amorphous substrate or a crystalline substrate.

We claim:

1. Method of making an electronic device comprising:
etching a substrate to provide the substrate with
an average transmittance of about 80% or greater over the visible spectrum;
a static coefficient of friction less than about 0.3,
a surface roughness Ra of about 500 nm or greater, and either one or both
a transmission haze greater than about 60%, and
a reflection haze at either 2 degrees from specular or 5 degrees from specular greater than 60%;
assembling the substrate in an enclosure; and
disposing electrical components at least partially inside the enclosure, the electronic components comprising a controller, a memory, and a display.

2. The method of claim 1, wherein the substrate comprises an amorphous substrate or a crystalline substrate.

3. The method of claim 2, wherein the substrate is amorphous and comprises any one of a soda lime glass, an alkali aluminosilicate glass, an alkali containing borosilicate glass and an alkali aluminoborosilicate glass.

4. The method of claim 2, wherein the substrate is amorphous and is strengthened.

5. The method of claim 2, wherein the substrate is amorphous and further comprises any one or more of
a compressive surface layer having a depth of layer (DOC) greater than or equal to 20 μm,
a surface compressive stress greater than 400 MPa, and
a central tension of more than 20 MPa.

6. The method of claim 2, wherein the substrate is crystalline and comprises a strengthened glass ceramic substrate, a non-strengthened glass-ceramic, or a single crystal structure.

7. The method of claim 1, wherein the substrate comprises an ink layer disposed a major surface of the substrate.

8. The method of claim 1, wherein the substrate comprises a colored glass.

9. The method of claim 1, wherein the transmission haze is greater than about 90%.

10. The method of claim 1, wherein the reflection haze at either 2 degrees from specular or 5 degrees from specular is greater than about 90%, as measured by a transparency meter.

11. The method of claim 1, further comprising a layer of hydrophobic material, oleophobic material or hydrophobic and oleophobic material.

12. The method of claim 1, wherein the Ra surface roughness is about 700 nm or greater.

13. The method of claim 1, wherein the substrate further comprises a tactile surface, the tactile surface comprising a plurality of features having a longest cross-sectional dimension in the range from about 10 micrometers to about 50 micrometers.

14. The method of claim 13, wherein the plurality of features comprise an average longest cross-sectional dimension is about 2 times or greater than the longest cross-sectional dimension.

15. The method of claim 13, wherein the plurality of features comprises an average longest cross-sectional dimension is about 2 times or less than the longest cross-sectional dimension.

16. The method of claim 1, wherein the electronic device is selected from a mobile phone, a tablet, a laptop, and a media player.

* * * * *

UNITED STATES PATENT AND TRADEMARK OFFICE
CERTIFICATE OF CORRECTION

| | | |
|---|---|---|
| PATENT NO. | : 10,928,561 B2 | Page 1 of 1 |
| APPLICATION NO. | : 16/677869 | |
| DATED | : February 23, 2021 | |
| INVENTOR(S) | : Jaymin Amin et al. | |

It is certified that error appears in the above-identified patent and that said Letters Patent is hereby corrected as shown below:

On the Title Page

On page 2, in Column 2, item (56), Other Publications, Line 2, delete "tribiology"" and insert -- tribology" --, therefor.

Signed and Sealed this
Twenty-seventh Day of July, 2021

Drew Hirshfeld
*Performing the Functions and Duties of the*
*Under Secretary of Commerce for Intellectual Property and*
*Director of the United States Patent and Trademark Office*